United States Patent [19]

Salisbury et al.

[11] 4,041,548
[45] Aug. 9, 1977

[54] HYBRID CIRCUIT PACKAGE

[75] Inventors: Ian David Salisbury, Galmpton; Roy Edward Ingram, Brixham, both of England

[73] Assignee: ITT Industries, Incorporated, New York, N.Y.

[21] Appl. No.: 650,201

[22] Filed: Jan. 19, 1976

[30] Foreign Application Priority Data

Mar. 11, 1975 United Kingdom ............... 10034/75

[51] Int. Cl.² .............................................. H05K 1/04
[52] U.S. Cl. .................................................. 361/396
[58] Field of Search ....... 317/101 CW, 101 R, 101 C, 317/101 D, 101 DH; 174/52 H; 324/73 PC; 361/396

[56] References Cited

U.S. PATENT DOCUMENTS

| | | | |
|---|---|---|---|
| 2,912,624 | 11/1959 | Wagner | 317/101 R |
| 3,270,252 | 8/1966 | Iversen | 317/101 R |
| 3,289,048 | 11/1966 | Allegretti et al. | 174/52 H |
| 3,569,139 | 7/1971 | Walsh | 317/101 R |
| 3,971,127 | 7/1976 | Giguere et al. | 174/68.5 |

*Primary Examiner*—David Smith, Jr.
*Attorney, Agent, or Firm*—John T. O'Halloran; Peter C. Van Der Sluys; Vincent B. Ingrassia

[57] ABSTRACT

This relates to a shock resistant hybrid circuit package which comprises a planar hybrid circuit held in a dismantleable framework. The dismantleable framework is, in turn, resiliently held in a hermetically sealed case. Sealed electrical connections are provided through the wall of the case.

2 Claims, 1 Drawing Figure

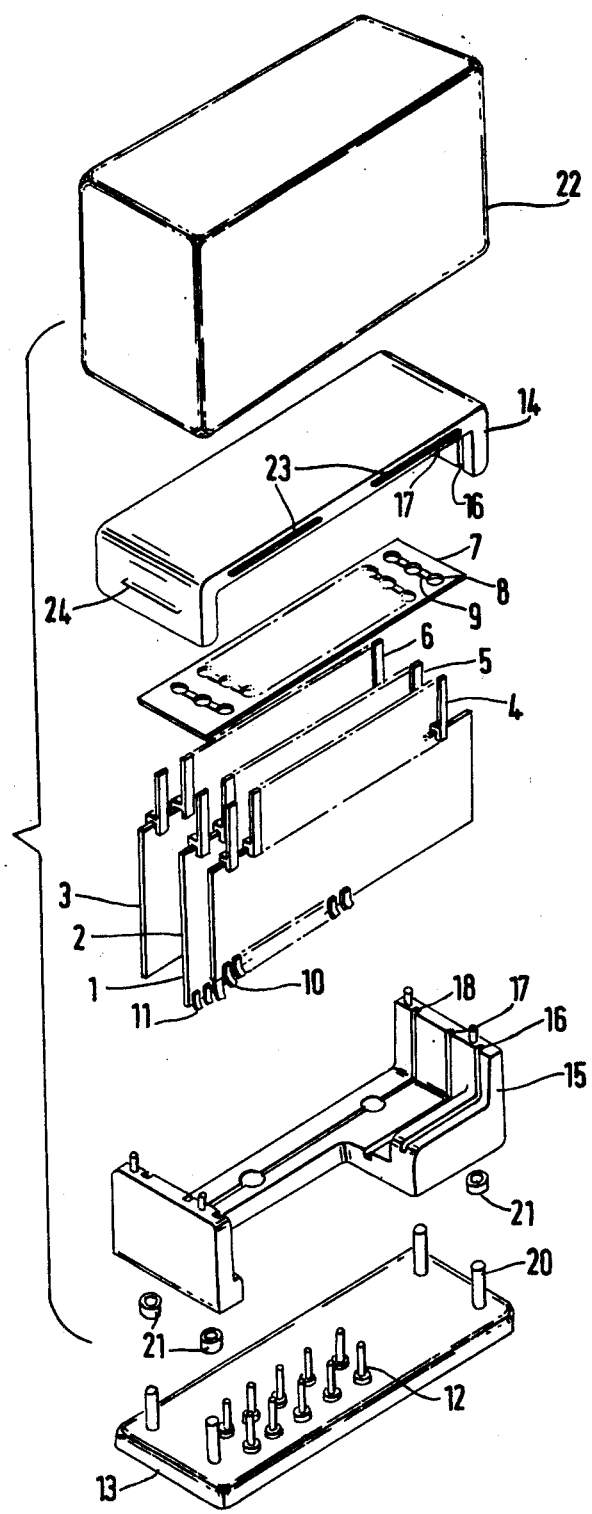

HYBRID CIRCUIT PACKAGE

BACKGROUND OF THE INVENTION

This invention relates to a hermetically packaged hybrid circuit assembly and to a method for manufacturing same.

In some applications, it is necessary to package single and multi-substrate hybrid electronic circuits such that they will be able to withstand high physical shock loading and temperature changes over a wide range without failure. If, for example, the hybrid circuits are both electrically connected and mechanically supported by glass/metal seal lead-outs on a glass header, possible fracture may occur as a result of external shock loading on the package or thermal stress.

SUMMARY OF THE INVENTION

It is an object of the present invention to provide a hermetically packaged hybrid circuit assembly which is capable of withstanding external shock loading and thermal stresses without being damaged.

It is a further object of the present invention to provide a method of making a hybrid circuit package which avoids the above disadvantages.

According to a broad aspect of the invention, there is provided a hybrid circuit package comprising: at least one planar circuit; a dismantleable framework for holding said at least one planar circuit; a hermetically sealed case for resiliently holding said dismantleable framework; and an electrical lead-out sealed in a wall of said case and coupled to said at least one planar circuit.

BRIEF DESCRIPTION OF THE DRAWING

The above and other objects of the present invention will be more clearly understood from the following detailed description taken in conjunction with the accompanying drawing which is an exploded isometric assembly drawing of the hermetically packaged hybrid circuit assembly according to the present invention.

DESCRIPTION OF THE PREFERRED EMBODIMENT

Referring to the drawing, three planar hybrid circuits 1, 2 and 3 each carry deposited thin or thick film components and separate added components (not shown) and an edge lead frame 4, 5 and 6 for interconnection. A printed circuit board 7 having holes 8 and interconnection printed strips 9 interconnect the frame leads of the three circuits. Flexible lead-out tags such as 10 and 11 are provided for connection to glass/metal seal lead-outs 12 on a glass header 13.

A molded plastic frame comprises two parts, a top molding 14 and a bottom molding 15 and has internal grooves 16, 17 and 18 into which the planar circuits fit. Molded locking pins such as 19 locate in blind holes (not shown) to align the top and bottom moldings together.

The top and bottom moldings, fitted together, are mounted on the header by means of locating pins such as 20 which locate in blind holes (not shown) in the underside of the bottom moulding 15. Compressible spacers 21 sit on the locating pins 20 between the bottom of the bottom molding and the inner surface of the header 13.

An outer can 22 fits onto the header 13 and is hermetically sealed to it. On the top molding 14 is some plastic flash 23 on the side edges and 24 on the end walls. This flash is "controlled" so that the plastic molded frame fits resiliently against the inner surface of the can 22.

During the manufacturing operations of this hermetically packaged hybrid circuit assembly, the two parts of the molded frame 14 and 15 act as a work carrier for the hybrid circuits and are dismantleable for, for example, replacement of a defective circuit and for adjustment of component parts in the circuits. For example, it may be necessary to adjust a particular electrical quantity to a desired value before sealing the can.

The controlled flash 23 and 24 and the compressible spacers 21 protect the hybrid circuits against external shock loading on the package. Also the substrates of the hybrid circuits fit easily in the grooves 16, 17 and 18 in the plastic frame and this accommodates wide changes in temperature without distortion, and possible fracture of a connection, in the hybrid circuits. Furthermore it is to be noted that the printed circuit board 7 when soldered to the lead frames forms a rigid physical structure and the flexible lead-outs 10 and 11 consequently incur negligible physical stress such as might be occasioned if the hybrid circuits were not only electrically connected by the lead-outs but also mechanically supported by them too.

The embodiment described is particularly applicable to high reliability multi-substrate applications and the glass/metal seal lead-outs would be connected to an external power supply.

What is claimed is:

1. A hybrid circuit package comprising:
   at least two hybrid circuits having several rigid leads;
   a printed circuit board secured substantially at right angles to the plane of each hybrid circuit for interconnecting said leads;
   a dismantleable framework for holding said at least two hybrid circuits and said printed circuit board, said dismantleable framework including first and second plastic molded parts having grooves therein for receiving and feeding said hybrid circuits;
   a hermetically sealed case for resiliently holding said dismantleable framework; and
   an electrical lead-out sealed in a wall of said case and coupled to said at least two hybrid circuits.

2. A hybrid circuit package according to claim 1 further including a controlled flash on the outer surfaces of said plastic molding, which flash bears resiliently against an inner surface of said hermetic case.

* * * * *